(12) United States Patent
Pelella

(10) Patent No.: US 7,439,127 B2
(45) Date of Patent: Oct. 21, 2008

(54) METHOD FOR FABRICATING A SEMICONDUCTOR COMPONENT INCLUDING A HIGH CAPACITANCE PER UNIT AREA CAPACITOR

(75) Inventor: Mario M. Pelella, Mountain View, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 344 days.

(21) Appl. No.: 11/409,362

(22) Filed: Apr. 20, 2006

(65) Prior Publication Data

US 2007/0249166 A1    Oct. 25, 2007

(51) Int. Cl.
*H01L 21/8242* (2006.01)
(52) U.S. Cl. .................. 438/240; 438/394; 438/785; 438/250; 438/689
(58) Field of Classification Search .......... 438/250, 438/239, 240, 394, 785
See application file for complete search history.

(56) References Cited

U.S. PATENT DOCUMENTS

| | | | |
|---|---|---|---|
| 6,461,914 B1 * | 10/2002 | Roberts et al. | 438/253 |
| 6,495,875 B2 * | 12/2002 | Bhowmik et al. | 257/301 |
| 6,936,514 B1 * | 8/2005 | Pelella | 438/250 |
| 2005/0063136 A1 | 3/2005 | Philofsky | |
| 2005/0164479 A1 * | 7/2005 | Perng et al. | 438/591 |
| 2005/0287718 A1 | 12/2005 | Berndlmaier et al. | |
| 2006/0049449 A1 | 3/2006 | Iino et al. | |
| 2007/0216029 A1 * | 9/2007 | Tsai | 257/758 |

FOREIGN PATENT DOCUMENTS

EP    0415751 A1    3/1991
JP    08088332    4/1996

OTHER PUBLICATIONS

Cramer, "Low temperature sputter deposition of Ba0.96Ca0.04Ti0.84Zr0.016O3 thin film on Ni electrodes", 2004, Mat. Res. Symp. Proc., vol. 811, pp. 261-266.*
International Search Report for International Application No. PCT/US2007/004374, mailed Dec. 4, 2007.
Yi, Woo-Chul et al., "Dielectric properties of Mg-doped Ba0.96Ca0.04Ti0.84Zr0.16O3 thin films fabricated by metalorganic decomposition method," Applied Physics Letters, AIP, American Institute of Physics, Melville, NY, US, vol. 78, No. 22, May 28, 2001, pp. 3517-3519, XP012028178.

(Continued)

*Primary Examiner*—Kimberly D Nguyen
*Assistant Examiner*—Mamadou Diallo
(74) *Attorney, Agent, or Firm*—Ingrassia Fisher & Lorenz, P.C.

(57) ABSTRACT

A method is provided for fabricating a semiconductor component that includes a capacitor having a high capacitance per unit area. The component is formed in and on a semiconductor on insulator (SOI) substrate having a first semiconductor layer, a layer of insulator on the first semiconductor layer, and a second semiconductor layer overlying the layer of insulator. The method comprises forming a first capacitor electrode in the first semiconductor layer and depositing a dielectric layer comprising $Ba_{1-x}Ca_xTi_{1-y}Zr_yO_3$ overlying the first capacitor electrode. A conductive material is deposited and patterned to form a second capacitor electrode overlying the dielectric layer, thus forming a capacitor having a high dielectric constant dielectric. An MOS transistor in then formed in a portion of the second semiconductor layer, the MOS transistor, and especially the gate dielectric of the MOS transistor, formed independently of forming the capacitor and electrically isolated from the capacitor.

20 Claims, 4 Drawing Sheets

OTHER PUBLICATIONS

Cramer, N. et al., "Low temperature sputter deposition of Ba0.96Ca0.04Ti0.84Zr0.16O3 thin films on Ni electrodes," Integration of Advanced Micro- and Nanoelectronic Devices-Critical Issues and Solutions, Apr. 13-16, 2004, San Francisco, CA, Apr. 13, 2004, pp. 261-266, XP002450504.

Vitanov, P. et al., "Thin metal oxide films for application in nanoscale devices," Electronics Technology: Meeting the Challenges of Electronics Technology Progress, 2004. 27th International Spring Seminar on Bankya, Bulgaria May 13-16, 2004, Piscataway NJ, US, IEEE, May 13, 2004, pp. 252-256, XP010818650.

Cramer et al.; "Low Temperature Deposited Ba0.96Ca0.04Ti0.84Zr0.16O3 Thin Films on Pt Electrodes by . . . "; Applied Physics Letters, vol. 84, No. 5, Feb. 2004, pp. 771-773.

* cited by examiner

METHOD FOR FABRICATING A SEMICONDUCTOR COMPONENT INCLUDING A HIGH CAPACITANCE PER UNIT AREA CAPACITOR

TECHNICAL FIELD

The present invention generally relates to a method for fabricating a semiconductor component, and more particularly relates to a method for fabricating a semiconductor component having a capacitor with a high dielectric constant dielectric.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS circuit. Certain improvements in performance of FET ICs can be realized by forming the FETs in a thin layer of semiconductor material overlying an insulator layer. Such semiconductor on insulator (SOI) FETs, among other benefis, exhibit lower junction capacitance and hence can operate at higher speeds.

The MOS transistors formed in and on the SOI layer are interconnected to implement the desired circuit function. A number of voltage busses are also connected to appropriate devices to power those devices as required by the circuit function. The voltage busses may include, for example, a $V_{dd}$ bus, a $V_{cc}$ bus, a $V_{ss}$ bus, and the like, and may include busses coupled to external power sources as well as busses coupled to internally generated or internally altered power sources. As used herein, the terms will apply to external as well as internal busses. As various nodes in the circuit are either charged or discharged during the operation of the circuit, the various busses must source or sink current to those nodes. Especially as the switching speed of the integrated circuits increases, the requirement of sourcing or sinking current by a bus can cause significant voltage spikes on the bus because of the inherent inductance of the bus. To avoid logic errors that might be caused by the voltage spikes, it has become commonplace to place decoupling capacitors between the busses. For example, such decoupling capacitors can be connected between the $V_{dd}$ and $V_{ss}$ busses. These decoupling capacitors are typically distributed along the length of the busses. The capacitors are usually formed as MOS capacitors with one plate of the capacitor formed by the same material used to form the gate electrode of the MOS transistors, the other plate of the capacitor formed by an impurity doped region in the SOI layer, and the dielectric separating the two plates of the capacitor formed by the gate dielectric.

One problem with such decoupling capacitors formed in the conventional manner is the size of the capacitors. There is a continuing effort to reduce the size of integrated circuit components so that an ever increasing number of components can be fabricated on a semiconductor chip of a given size. The size of the conventionally fabricated decoupling capacitors is an impediment to the continuing effort. To increase the capacitance per unit area of a conventionally fabricated decoupling capacitor, which would allow a reduction in capacitor size, the thickness of the capacitor dielectric must be reduced. Reducing the thickness of the capacitor dielectric leads to problems of increased capacitor leakage current as well as reduced reliability. Additionally, it is disadvantageous to require that the same dielectric material be used for both the gate dielectric of MOS transistors and for the capacitor dielectric because such requirement limits the flexibility of the fabrication process.

Accordingly, it is desirable to provide a method for fabricating an integrated circuit that includes high capacitance per unit area capacitors without resorting to very thin dielectric layers. In addition, it is desirable provide methods for fabricating integrated circuits including capacitors in which the capacitor dielectric is formed separately from the gate insulator of MOS transistors of the IC. Furthermore, other desirable features and characteristics of the present invention will become apparent from the subsequent detailed description and the appended claims, taken in conjunction with the accompanying drawings and the foregoing technical field and background.

BRIEF SUMMARY

A method is provided for fabricating a semiconductor component that includes a capacitor having a high capacitance per unit area. The component is formed in and on a semiconductor on insulator (SOI) substrate having a first semiconductor layer, a layer of insulator on the first semiconductor layer, and a second semiconductor layer overlying the layer of insulator. The method comprises forming a first capacitor electrode in the first semiconductor layer and depositing a dielectric layer comprising $Ba_{1-x}Ca_xTi_{1-y}Zr_yO_3$ overlying the first capacitor electrode. A conductive material is deposited and patterned to form a second capacitor electrode overlying the dielectric layer, thus forming a capacitor having a high dielectric constant dielectric. An MOS transistor in then formed in a portion of the second semiconductor layer, the MOS transistor, and especially the gate dielectric of the MOS transistor, formed independently of forming the capacitor and electrically isolated from the capacitor.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Novel methods for fabricating semiconductor integrated circuits (ICs) have been disclosed in U.S. Pat. No. 6,936,514, the entire disclosure of which is incorporated herein by reference. The present invention overcomes certain shortcomings of the methods disclosed in U.S. Pat. No. 6,936,514 by providing methods for fabricating ICs that incorporate high dielectric constant ("high-K") insulator materials as a capacitor dielectric to increase capacitance efficiency (increased capacitance per unit area) and reduce leakage currents without impacting the gate insulator film of the transistors implementing the IC.

FIGS. 1-12 illustrate, in cross section, method steps for fabricating a semiconductor component 20 in accordance with an embodiment of the invention. Semiconductor component 20 includes an MOS transistor 22 and a decoupling capacitor 24. Those of skill in the art will appreciate that an IC might include a large number of MOS transistors similar to MOS transistor 22 and also a large number of decoupling capacitors such as decoupling capacitor 24. The MOS transistors could include both N-channel and P-channel MOS transistors and those transistors would be arrayed and interconnected to implement the desired integrated circuit. The decoupling capacitors would be coupled in appropriate locations between, for example, $V_{dd}$ and $V_{ss}$ busses to help regulate the voltages supplied on those busses. Although the term "MOS device" properly refers to a device having a metal gate electrode and an oxide gate insulator, that term will be used throughout to refer to any semiconductor transistor that includes a conductive gate electrode (whether metal or other conductive material) that is positioned over a gate insulator (whether oxide or other insulator) which, in turn, is positioned over a semiconductor substrate. Various steps in the manufacture of MOS components are well known and so, in the interest of brevity, many conventional steps will only be mentioned briefly herein or will be omitted entirely without providing the well known process details.

Figure 1:
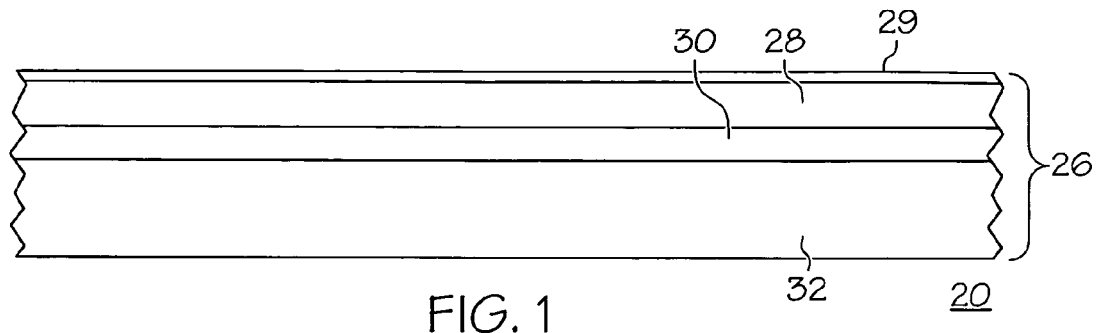
FIGS. 1-12 illustrate, in cross section, method steps for fabricating a semiconductor component in accordance with an embodiment of the invention.

As illustrated in FIG. 1, the method in accordance with one embodiment of the inventions begins by forming a semiconductor-on-insulator (SOI) substrate 26 that includes a thin semiconductor layer 28 over an insulator layer 30 which is supported by a further semiconductor layer 32. Preferably both semiconductor layer 28 and semiconductor layer 32 are monocrystalline silicon layers, although other semiconductor materials could also be used. As used herein, the terms "silicon layer" and "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. For ease of discussion the semiconductor materials described herein will be limited to silicon as that term has just been defined, although those of skill in the art will recognize that the semiconductor material could also be other materials such as germanium or the one of the compound semiconductor materials.

SOI substrate 26 can be formed by a number of well known processes such as the well known layer transfer technique. In that technique high doses of hydrogen are implanted into a subsurface region of an oxidized monocrystalline silicon wafer to form an hydrogen stressed subsurface layer. The implanted wafer is then flip bonded to monocrystalline silicon substrate 32. A two phase heat treatment is then carried out to split the hydrogen implanted wafer along the implanted region and to strengthen the bonding, leaving a thin monocrystalline silicon layer 28 bonded to the monocrystalline silicon substrate and separated from the substrate by a dielectric insulating layer 30. The monocrystalline silicon layer is then thinned and polished, for example by chemical mechanical planarization (CMP) techniques, to a thickness of about 5-50 nanometers (nm) depending on the circuit function being implemented. Both the monocrystalline silicon layer and the monocrystalline silicon carrier substrate preferably have a resistivity of at least about 1-35 Ohms per square. Silicon layer 28 can be impurity doped either N-type or P-type, but is preferably doped P-type. Substrate layer 32 is preferably doped P-type. Dielectric insulating layer 30, typically silicon dioxide, preferably has a thickness of about 50-200 nm.

Figure 2:
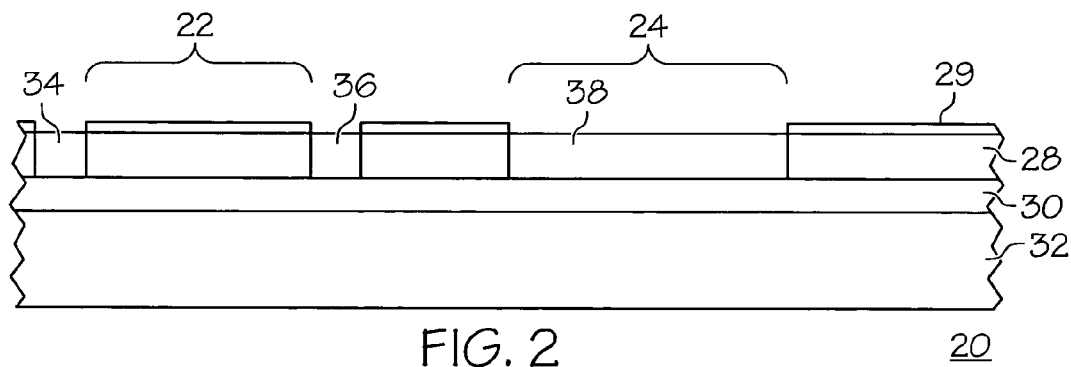

As illustrated in FIG. 2, the method continues by electrically isolating various regions of silicon layer 28, for example by forming shallow trench isolation (STI) regions 34, 36, and 38 that extend through the thickness of the silicon layer. As is well known, there are many processes that can be used to form the STI, so the process need not be described here in detail. In general, STI includes a shallow trench that is etched into the surface of the semiconductor substrate and that is subsequently filled with an insulating material. After the trench is filled with an insulating material such as silicon oxide, the surface is usually planarized, for example by chemical mechanical planarization (CMP). The STI serves to isolate decoupling capacitor 24 from MOS transistor 22 and to provide isolation between transistors as required by the circuit being implemented.

Figure 3:
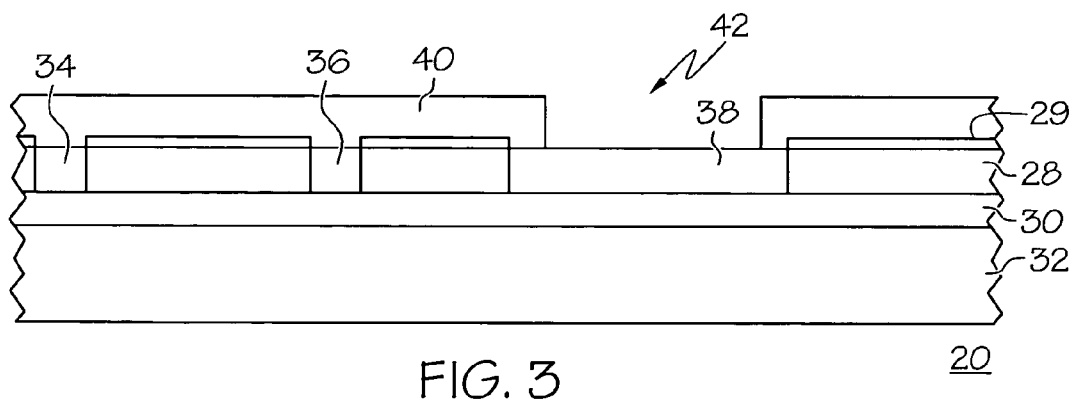
Figure 4:
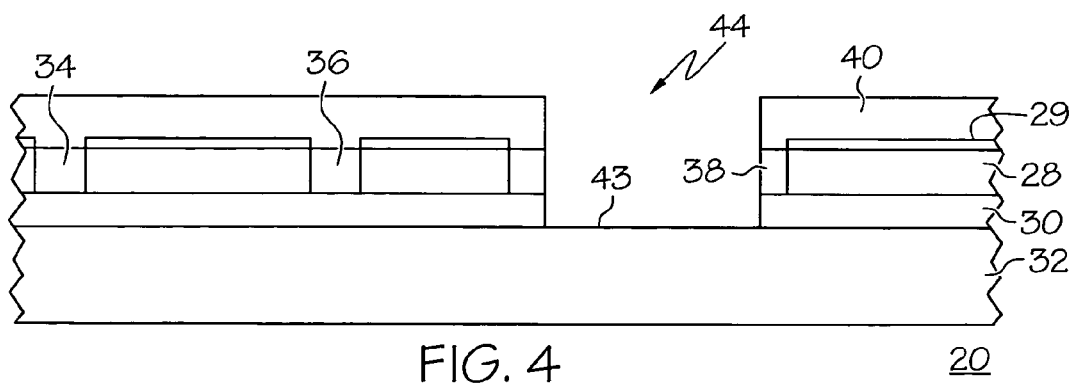

As illustrated in FIG. 3, a layer of photoresist 40 is applied over the top of the STI and silicon layer 28 and is patterned to form an opening 42 that exposes a portion of STI 38. As illustrated in FIG. 4, using the patterned photoresist as an etch mask, the exposed portion of STI 38 is etched, for example by reactive ion etching (RIE). The reactive ion etching is continued, etching through oxide layer 30, to expose a portion 43 of silicon layer 32. An etched opening 44 thus extends through both STI 38 and oxide 30 to the underlying silicon.

Figure 5:
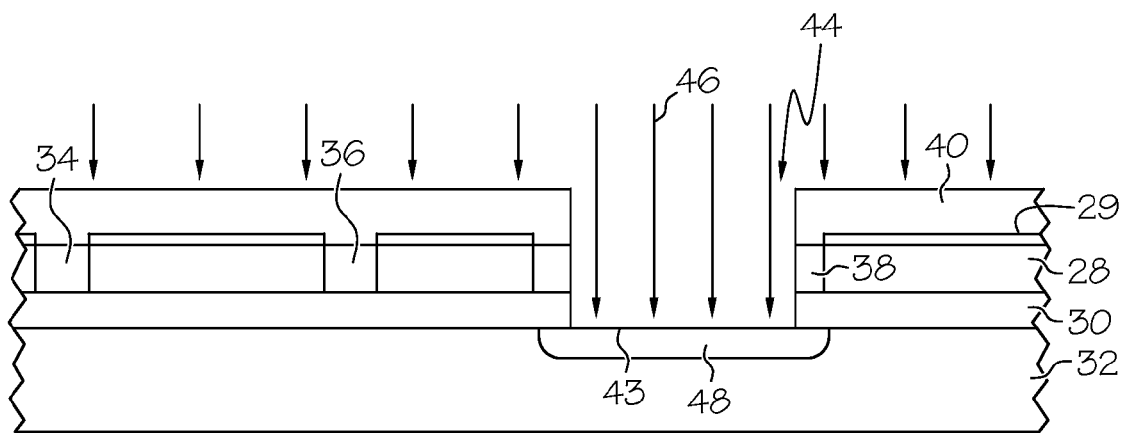

In accordance with one embodiment of the invention N-type conductivity determining ions are implanted (as indicated by arrows 46) through opening 44 to form an N-type impurity doped region 48 in exposed portion 43 of silicon layer 32 as illustrated in FIG. 5. Patterned photoresist mask 40 can be used as an ion implant mask for this step.

Figure 6:
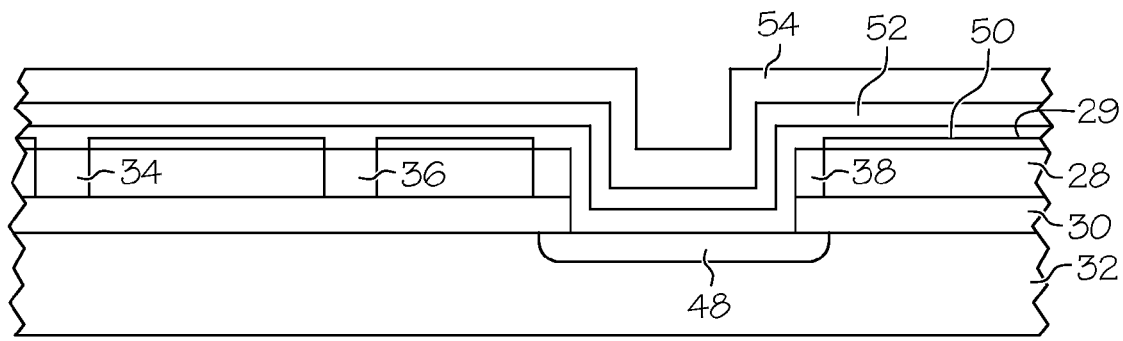

After removing the patterned photoresist mask and carefully cleaning the surface of the doped region, a layer of metal 50 is deposited onto the surface of the doped region and overlying silicon layer 28 and the STI regions as illustrated in FIG. 6. The metal layer can be deposited by physical vapor deposition (PVD), for example by magnetron sputtering. Preferably layer of metal 50 is a layer of nickel having a thickness of about 100 nm. Following the deposition of the layer of metal, a layer of dielectric material 52 comprising barium, calcium, titanium zirconium, and oxygen (BCTZ) is deposited onto metal layer 50. Preferably the BCTZ layer has a composition given by $Ba_{1-x}Ca_xTi_{1-y}Zr_yO_3$ and most preferably has a composition given by $Ba_{0.96}Ca_{0.04}Ti_{0.84}Zr_{0.16}O_3$. The BCZT layer can be deposited by rf magnetron sputtering in the manner described in "Low temperature deposited $Ba_{0.96}Ca_{0.04}Ti_{0.84}Zr_{0.16}O_3$ thin films on Pt electrodes by radio frequency magnetron sputtering" by Cramer et al., Applied Physics Letters, Vol. 84, No. 5, February 2004, pp 771-773, the entire disclosure of which is incorporated herein by reference. The BCZT layer is preferably deposited to a thickness of about 20 nm. In accordance with one embodiment of the invention the BCZT layer is insitu impurity doped with scandium to reduce leakage currents through the BCZT layer. The BCZT layer can be rf magnetron sputtered from a target that comprises barium, calcium, titanium, zirconium, oxygen, and a dopant material such as scandium. Following the deposition of the BCZT layer, a second metal layer 54 is deposited onto the BCZT layer. Preferably metal layer 54 is a nickel layer deposited by PVD to a thickness of greater than about 150 nm. In a preferred embodiment of the invention metal layer 50 and metal layer 54 are both nickel and metal layer 50/BCZT layer 52/metal layer 54 are sequentially deposited by rf magnetron sputtering without breaking seal in the sputtering apparatus. The preferred composition of the BCZT layer results in a stable, low leakage layer having a dielectric constant of greater than ??? that is compatible with subsequent standard MOS processing.

Figure 7:
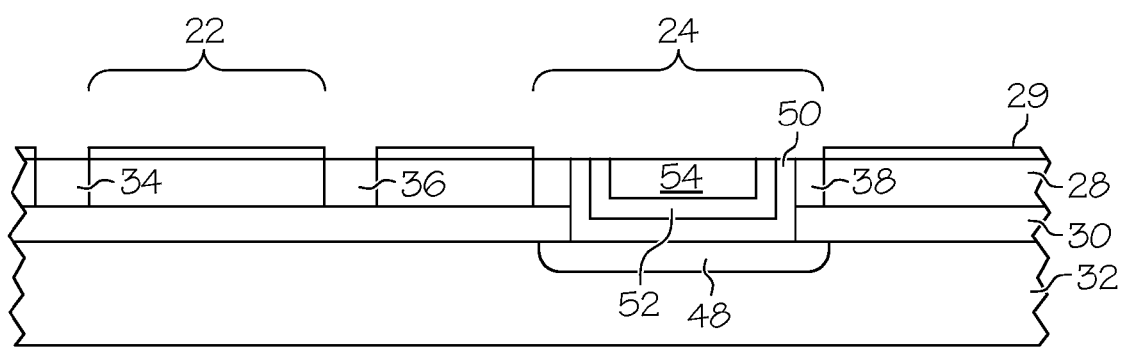

As illustrated in FIG. 7, the method in accordance with an embodiment of the invention continues by planarizing the metal/BCZT/metal layers, for example by chemical mechanical planarization (CMP) to remove the deposited layers overlying silicon layer 28 and the STI regions. Metal layer 50, together with impurity doped region 48 will form one plate of decoupling capacitor 24; BCZT layer 52 forms the dielectric layer of that capacitor; and metal layer 54 forms the other plate of the capacitor. Either before or after the planarization the BCZT layer can be annealed to increase the dielectric constant of the layer. Preferably the layer is annealed by rapid thermal annealing (RTA) for a time of about ????? at a temperature greater than 450° C. and most preferably for a time of about ????? at a temperature greater than 1000° C. such as a temperature of about 1100-1150° C. The annealing at such high temperatures is possible because the annealing takes place before the fabrication of MOS transistor 22. High temperature annealing increases the dielectric constant of the BCZT layer to about ????.

Figure 8:
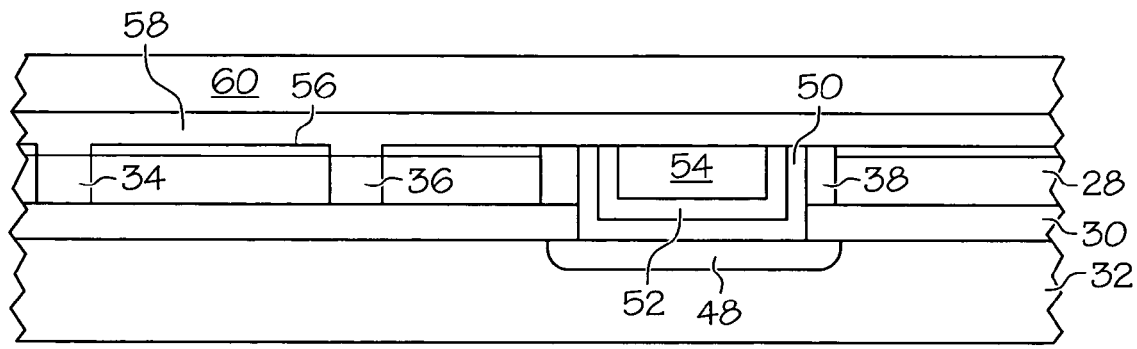

Following the CMP and annealing steps the exposed surface of silicon layer 28 is cleaned in preparation for beginning fabrication of MOS transistor 22. MOS transistor 22 can be fabricated in accordance with standard MOS processing that is integrated with steps to complete the fabrication and interconnection of capacitor 24 into the circuit function. As illustrated in FIG. 8, a thin layer of gate oxide 56 is thermally grown at the surface of silicon layer 28. Gate oxide 56 preferably has a thickness of about 1-5 nm. The gate oxide could also be deposited, for example, by chemical vapor deposition (CVD) or low pressure chemical vapor deposition (LPCVD). As mentioned above, the gate insulator does not need to be silicon oxide and can instead be, for example, a high K dielectric material such as HfSiO, or the like. The gate insulator is formed independently of capacitor insulator 52. In accordance with one embodiment of the invention a layer 58 of undoped polycrystalline silicon having a thickness of about 50 nm is deposited onto the gate insulator. The polycrystalline silicon can be deposited, for example, by CVD by the reduction of silane. A layer 60 of photoresist is applied to the surface of the layer of polycrystalline silicon. Although not illustrated, as is well known, a layer of antireflective coating material may also be deposited between layer 58 and layer 60 to facilitate the subsequent patterning of polycrystalline silicon layer 58.

Figure 9:
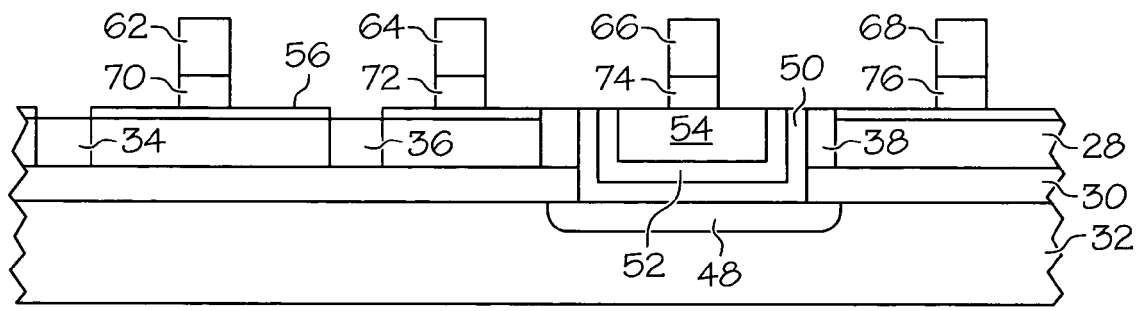

Layer 60 of photoresist is patterned as an etch mask for the subsequent patterning of polycrystalline silicon layer 58 to form the gate electrode of MOS transistor 22 as well as the gate electrodes of other MOS transistors of the IC. As illustrated in FIG. 9, the photoresist is preferably patterned in a regular array of masks 62, 64, 66, 68. Mask 62 is then used to pattern polycrystalline silicon layer 58 to form gate electrode 70 of MOS transistor 22. Masks 64, 66, and 68 are used to form dummy gates 72, 74, and 76. The constant mask pattern reduces proximity effects associated with the photolithography steps used during the formation of gate electrode 70 and the dummy gates. The array of masks is used as an etch mask and polycrystalline silicon layer 58 is etched, for example by RIE, to form gate electrode 70 and dummy gates 72, 74, and 76.

Figure 10:
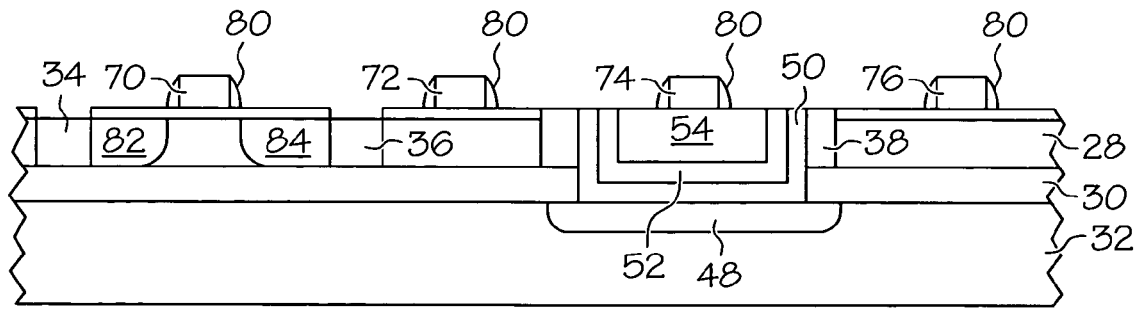

After removing patterned photoresist layer 60, sidewall spacers 80 can be formed on the sidewalls of gate electrode 70 and dummy gates 72, 74, and 76. The sidewall spacers can be formed, as is well known, by depositing a layer of silicon oxide or other spacer forming material. The spacer forming material is anisotropically etched, for example by RIE, to remove the material from horizontal surfaces while leaving spacers on the vertical surfaces. As illustrated in FIG. 10, source 82 and drain 84 regions of MOS transistor 22 are formed by implanting conductivity determining ions into silicon layer 28 using gate electrode 70, sidewall spacers 80 and a patterned photoresist layer (not illustrated) as an ion implantation mask. The patterned photoresist layer protects those portions of the circuit which should not be implanted at the same time as the source and drain regions. The implanted ions can be, for example, arsenic or phosphorus if MOS transistor 22 is an n-channel transistor, and can be boron if the transistor is a p-channel transistor. Those of skill in the art will understand that multiple sidewall spacers and multiple ion implantations may be used in the fabrication of MOS transistor 22 and that multiple n-channel and/or p-channel MOS transistors may be fabricated to implement the desired circuit function.

Figure 11:
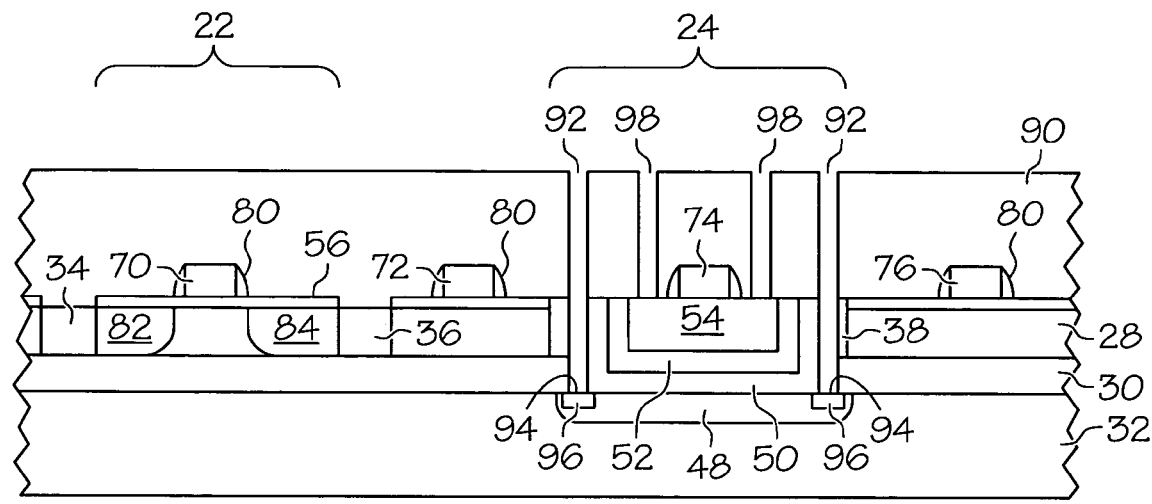

A layer of dielectric material 90 is deposited over MOS transistor 22 and decoupling capacitor 24 and the top surface of the layer is planarized, for example by CMP. One or more contact openings 92 are etched through dielectric material 90, STI 38, and oxide layer 30 to expose a portion 94 of impurity doped region 48. Preferably contact openings 92 are also formed either adjacent to or through a portion of metal layer 50 so that a portion of metal layer 50 is exposed by the contact openings. As illustrated in FIG. 11, the contact resistance of portion 94 can be reduced by either implanting n-type conductivity determining ions into the surface of impurity doped region 48 to form a heavily impurity doped region or by forming a metal silicide at that surface. Either the heavily doped region or the metal silicided region is indicated by the numeral 96. Either the heavily doped region or the metal silicided region can be formed through contact openings 92 using the remainder of dielectric material 90 as a mask. One or more further contact openings 98 are then etched through dielectric material 90 to expose a portion of second metal layer 54. Although not illustrated, those of skill in the art will understand that additional contact openings, for example to the source, drain, or gate electrode of MOS transistor 22 can be etched at the same time as contact openings 92 or 98.

Figure 12:
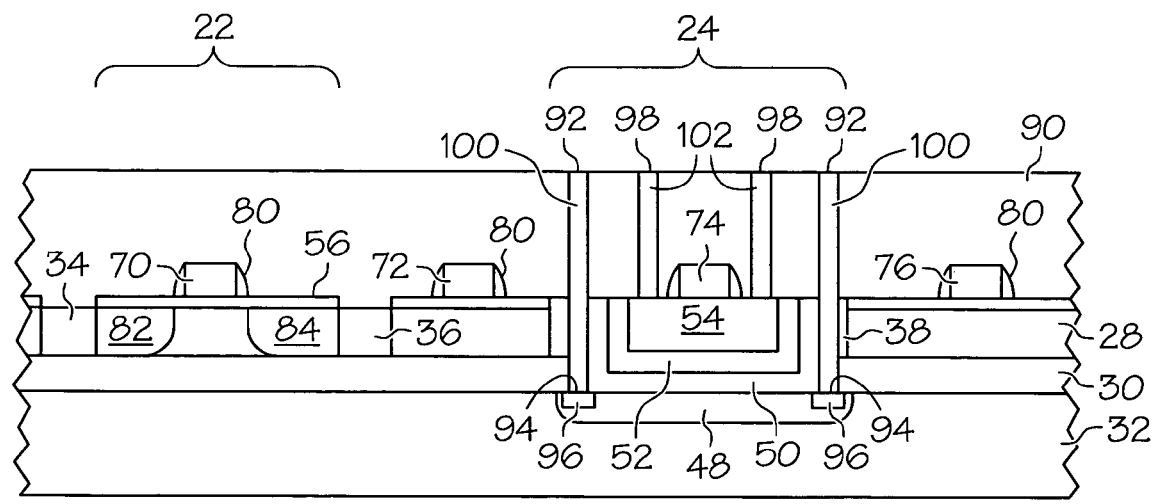

As illustrated in FIG. 12, contact openings 92 and 98 are filled with conductive plugs 100 and 102, respectively. Conductive plugs 100 and 102 can be, for example, tungsten plugs formed by sequential layers of titanium, titanium nitride, and tungsten. Excess conductive material is removed from the surface of dielectric layer 90 by CMP. Conductive plugs 100 electrically contact impurity doped region 48 and preferably also contact first metal layer 50 as that metal layer is exposed along the side of contact openings 92. By contacting both metal layer and impurity doped region 48, the resistance to the bottom plate of capacitor 24 is reduced.

Although not illustrated, fabrication of the integrated circuit can be completed, in a manner well know to those of skill in the art, by steps such as depositing and patterning further dielectric layers, etching openings through those layers, depositing and patterning metal layers to contact and interconnect the various devices that make up the total integrated circuit, and the like. Such steps are well known and need not be described in detail herein.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor component including a semiconductor on insulator (SOI) substrate having a first semiconductor layer, a layer of insulator on the first semiconductor layer, and a second semiconductor layer overlying the layer of insulator, the method comprising the steps of:

etching an opening through the layer of insulator to expose a portion of the first semiconductor layer;

depositing a first layer of metal overlying the second semiconductor layer and into the opening and contacting the exposed portion of the first semiconductor layer;

depositing a dielectric layer comprising $Ba_{1-x}Ca_xTi_{1-y}Zr_yO_3$ overlying the first layer of metal;

depositing a second layer of metal overlying the dielectric layer;

annealing the dielectric layer at a temperature in excess of 450° C.;

removing a portion of the first layer of metal, the dielectric layer, and the second layer of metal overlying the second semiconductor layer to expose a surface of the second semiconductor layer;

forming a layer of gate insulator at the surface of the second semiconductor layer; and depositing and patterning a layer of gate electrode material to form a gate electrode overlying the layer of gate insulator.

2. The method of claim 1 wherein the step of depositing a first layer of metal comprises the step of depositing a layer of nickel and the step of depositing a second layer of metal comprises the step of depositing a layer of nickel.

3. The method of claim 1 wherein the step of depositing a dielectric layer comprises the step of depositing a dielectric layer comprising $Ba_{0.96}Ca_{0.04}Ti_{0.84}Zr_{0.16}O_3$.

4. The method of claim 3 wherein the step of depositing a dielectric layer comprises the step of depositing a dielectric layer by a process of rf magnetron sputtering.

5. The method of claim 1 wherein the step of depositing a dielectric layer comprises the step of depositing a dielectric layer by a process of magnetron sputtering.

6. The method of claim 5 wherein the step of depositing a dielectric layer by a process of magnetron sputtering comprises the step of depositing a dielectric layer by a process of magnetron sputtering using a target comprising barium, calcium, titanium, zirconium, oxygen, and a dopant material.

7. The method of claim 1 wherein the step of annealing the dielectric layer comprises the step of annealing the dielectric layer at a temperature greater than 1000° C.

8. The method of claim 1 further comprising the step of implanting conductivity determining ions through the opening and into the first semiconductor layer to form a first electrode of a capacitor.

9. The method of claim 8 further comprising the steps of:

etching a second opening through at least a portion of the first metal layer to expose a portion of the first electrode; and depositing a conductive material into the second opening to electrically contact the first metal layer and the first electrode.

10. A method for fabricating a semiconductor component including a semiconductor on insulator (SOI) substrate having a first semiconductor layer, a layer of insulator on the first semiconductor layer, and a second semiconductor layer overlying the layer of insulator, the method comprising the steps of:

etching a first opening extending through the second semiconductor layer to the layer of insulator;

depositing an oxide overlying the second semiconductor layer and filling the first opening;

planarizing the oxide by a process of chemical mechanical planarization to expose a surface of the second semiconductor layer;

etching a second opening extending through the oxide and the layer of insulator to expose a portion of the first semiconductor layer;

implanting conductivity determining ions through the second opening to form an impurity doped region in the first semiconductor layer;

contacting the impurity doped region with a first layer of metal;

depositing a dielectric layer comprising $Ba_{1-x}Ca_xTi_{1-y}Zr_yO_3$ over the first layer of metal;

depositing a second layer of metal overlying the dielectric layer;

removing a portion of the first layer of metal, the dielectric layer, and the second layer of metal overlying the second semiconductor layer by a process of chemical mechanical planarization;

etching a third opening through the first layer of metal to expose a portion of the impurity doped region; and forming a first electrically conductive contact to the impurity doped region and a second electrically conductive contact to the second layer of metal.

11. The method of claim 10 wherein the step of depositing a dielectric layer comprises the step of depositing a dielectric layer comprising $Ba_{0.96}Ca_{0.04}Ti_{0.84}Zr_{0.16}O_3$.

12. The method of claim 11 wherein the step of depositing a dielectric layer further comprises the step of doping the layer comprising $Ba_{0.96}Ca_{0.04}Ti_{0.84}Zr_{0.16}O_3$ with a dopant material.

13. The method of claim 12 wherein the step of doping comprises the step of doping with a material comprising scandium.

14. The method of claim 10 further comprising the step of annealing the dielectric layer at a temperature above 1000° C.

15. The method of claim 10 further comprising the step of forming an MOS transistor in and on the second semiconductor layer.

16. The method of claim 10 wherein the step of forming a first electrically conductive contact to the impurity doped region further comprises the step of forming the first electrically conductive contact to the first layer of metal.

17. A method for fabricating a semiconductor component including a semiconductor on insulator (SOI) substrate having a first semiconductor layer, a layer of insulator on the first semiconductor layer, and a second semiconductor layer overlying the layer of insulator, the method comprising the steps of:

forming an impurity doped region in the first semiconductor layer;

depositing a first metal layer in electrical contact with the impurity doped region to form a first capacitor electrode;

depositing a dielectric layer comprising $Ba_{1-x}Ca_xTi_{1-y}Zr_yO_3$ overlying the first capacitor electrode;

depositing and patterning a metal material to form a second capacitor electrode overlying the dielectric layer;

forming an MOS transistor in a portion of the second semiconductor layer; and electrically isolating the MOS transistor from the second capacitor electrode by a shallow trench isolation region.

18. The method of claim 17 wherein the step of depositing a dielectric layer comprises the step of depositing a dielectric layer comprising $Ba_{0.96}Ca_{0.04}Ti_{0.84}Zr_{0.16}O_3$.

19. The method of claim 18 wherein the step of depositing a dielectric layer further comprises the step of doping the dielectric layer.

20. The method of claim 17 further comprising the step of depositing an additional conductive material in contact with the first capacitor electrode.

* * * * *